(12) United States Patent
Li et al.

(10) Patent No.: US 11,594,631 B2
(45) Date of Patent: Feb. 28, 2023

(54) LDMOS TRANSISTOR AND MANUFACTURE THEREOF

(71) Applicant: SiEn (QingDao) Integrated Circuits Co., Ltd., Shandong (CN)

(72) Inventors: Min Li, Qingdao (CN); Min-Hwa Chi, Qingdao (CN); Richard Ru-Gin Chang, Qingdao (CN)

(73) Assignee: SiEn (QingDao) Integrated Circuits Co., Ltd., Qingdao (CN)

( * ) Notice: Subject to any disclaimer, the term of this patent is extended or adjusted under 35 U.S.C. 154(b) by 15 days.

(21) Appl. No.: 17/352,222

(22) Filed: Jun. 18, 2021

(65) Prior Publication Data

US 2021/0399129 A1 Dec. 23, 2021

(30) Foreign Application Priority Data

Jun. 23, 2020 (CN) .......................... 202010583302.1

(51) Int. Cl.
*H01L 29/78* (2006.01)
*H01L 29/06* (2006.01)
*H01L 29/66* (2006.01)

(52) U.S. Cl.
CPC ...... *H01L 29/7824* (2013.01); *H01L 29/0653* (2013.01); *H01L 29/66689* (2013.01); *H01L 29/78391* (2014.09)

(58) Field of Classification Search
CPC combination set(s) only.
See application file for complete search history.

(56) References Cited

U.S. PATENT DOCUMENTS

2015/0097236 A1* 4/2015 Tsai .................... H01L 29/0623 438/286

* cited by examiner

*Primary Examiner* — Moin M Rahman
*Assistant Examiner* — Mohammad A Rahman
(74) *Attorney, Agent, or Firm* — Chen Yoshimura LLP (57) ABSTRACT

The present application provides a laterally diffused metal oxide semiconductor (LDMOS) transistor and a manufacturing method thereof. The transistor comprising: a semiconductor substrate having a doping region, wherein the doping region comprises a first well region and a second well region with opposite doping types; a source region, a drain region, a shallow trench isolation (STI) structure comprising a laminated structure having an alternate layers of insulating material and ferroelectric material, a gate, a contact hole, and a metal layer. The LDMOS transistor simultaneously increases breakdown voltage (BV) and reduces on-resistance ($R_{on}$).

13 Claims, 6 Drawing Sheets

```
┌─────────────────────────────────────────────────────────────┐
│ providing a semiconductor substrate, wherein a doping       │
│ region of a first doping type formed in an upper part of    │──S1
│ the semiconductor substrate                                 │
└─────────────────────────────────────────────────────────────┘
                             │
                             ▼
┌─────────────────────────────────────────────────────────────┐
│ forming a STI structure between a source region and a       │
│ drain region located in the doping region of the first      │
│ doping type, wherein the STI structure comprises a          │
│ laminated structure formed in a shallow trench, the         │──S2
│ laminated structure comprises an alternate stack of         │
│ insulating material layers and ferroelectric material       │
│ layers, and, in the laminated structure, a lowest layer     │
│ and a uppermost layer are the insulating material layers    │
└─────────────────────────────────────────────────────────────┘
                             │
                             ▼
┌─────────────────────────────────────────────────────────────┐
│ forming a first well region of the first doping type and a  │
│ second well region of a second doping type in the doping    │──S3
│ region of the first doping type, wherein the first doping   │
│ type and the second doping type opposite to each other      │
└─────────────────────────────────────────────────────────────┘
                             │
                             ▼
┌─────────────────────────────────────────────────────────────┐
│ forming a gate on the semiconductor substrate, wherein the  │
│ gate has one side extending above the second region of the  │──S4
│ second doping type and an opposite side extending to and    │
│ above the STI structure                                     │
└─────────────────────────────────────────────────────────────┘
                             │
                             ▼
┌─────────────────────────────────────────────────────────────┐
│ forming a light doping region of a source region in the     │──S5
│ second well region of the second doping type                │
└─────────────────────────────────────────────────────────────┘
                             │
                             ▼
┌─────────────────────────────────────────────────────────────┐
│ forming a heavy doping region of a source region in the     │
│ second well region of the second doping type, and forming   │──S6
│ a heavy doping region of a drain region in the first well   │
│ region of the first doping type                             │
└─────────────────────────────────────────────────────────────┘
                             │
                             ▼
┌─────────────────────────────────────────────────────────────┐
│ forming a contact hole in the gate and in the insulating    │──S7
│ material layer of the uppermost layer of the laminated      │
│ structure                                                   │
└─────────────────────────────────────────────────────────────┘
                             │
                             ▼
┌─────────────────────────────────────────────────────────────┐
│ forming a metal layer electrically connecting to the        │──S8
│ contact hole                                                │
└─────────────────────────────────────────────────────────────┘
```

LDMOS TRANSISTOR AND MANUFACTURE THEREOF

BACKGROUND OF THE INVENTION

1. Field of the Invention

The present invention relates to a technical field of double diffused metal oxide semiconductor field effect transistor (DMOSFET or DMOS), and more particularly to a laterally diffused metal oxide semiconductor field effect transistor (LDMOSFET or LDMOS) and the manufacturing methods thereof.

2. Description of the Related Art

In power device applications, the vertical double-diffused metal-oxide-semiconductor (DMOS) utilizes vertical device structure (similar to vertical NPN bipolar transistor structure) has various advantages including high current drive capability, low on-resistance ($R_{on}$), high breakdown voltage (BV) and the like. DMOS transistor mainly has two types: the vertical double-diffused metal oxide semiconductor field effect transistor (VDMOS) and also the laterally double-diffused metal oxide semiconductor field effect transistor (LDMOS). Comparing with the conventional planar field effect transistor, the LDMOS transistor has significant advantages on the critical device properties such as gain, linearity, switch performance, heat dissipation, high breakdown voltage, reduction of stages in circuit design and the like. In addition, LDMOS transistor is widespread in applications because it is easily compatible with CMOS process.

In LDMOS transistor, the breakdown voltage (BV) is an important parameter to determine the device performance. Currently, a longer length of the shallow trench isolation (STI) in the drift zone is a usual way to increase the BV of the conventional LDMOS transistor. However, the increase of the STI length results in rapid increase of $R_{on}$ of the device, and is adverse to miniaturization of the device. Therefore, the STI structure design in drift zone has tradeoffs between high BV and low Ron in LDMOS transistor.

SUMMARY

Considering the drawbacks of the conventional technologies, the present application provides a LDMOS transistor structure and its manufacturing method thereof. The present application is able to provide new STI structure in drift zone with better tradeoff between high BV and low Ron of the LDMOS transistor For the above and other relevant purposes, the present application provides a LDMOS transistor comprising:

a semiconductor substrate having a doping region of a first doping type formed in an upper part of the semiconductor substrate, wherein the doping region comprises a first well region of the first doping type and a second well region of a second doping type, and the first doping type and the second doping type are opposite in polarity to each other;

a source region located in the second well region and a drain region located in the first well region;

a shallow trench isolation (STI) structure between the source region and the drain region, wherein the STI structure comprises a laminated structure formed in a shallow trench, the laminated structure comprises a stack of alternate layers of insulating material and ferroelectric material and in the laminated structure a lowest layer and an uppermost layer are the insulating material;

a gate on the semiconductor substrate, wherein the gate has one side extending above the source region and an opposite side extending above the STI structure;

a contact hole connecting the gate (referred to as gate contact) and a contact hole on the insulating material layer of the uppermost layer of the laminated structure (referred to as "shielding contact") for convenience; and a metal layer electrically connecting to the gate contact and shielding contact on STI.

In one embodiment, the material of the ferroelectric material layers comprises a hafnium oxide-based ferroelectric material with doping of aluminum and/or zirconium In one embodiment, the shallow trench has a depth of 4800 Å~5400 Å, and a distance between the bottom wall of the lowest ferroelectric material layer of the laminated structure and the bottom of the shallow trench is 100 Å~600 Å.

In one embodiment, the laminated structure comprises N layer of the ferroelectric material layers, in which N≤3, each layer of the ferroelectric material layers has a thickness of 500 Å-1200 Å, and the neighboring two ferroelectric material layers has an interval distance of 200 Å~500 Å.

In one embodiment, the second well region of the second doping type comprises a heavy doping region of the second doping type contacting the source region, and the heavy doping region locates at one side away from the gate.

In one embodiment, the first doping type is N type or P type.

In one embodiment, the STI structure is in contact with the drain region, and the gate comprises a gate dielectric layer on the semiconductor substrate, and a gate polysilicon layer on the gate dielectric layer, and a side wall spacer covering the side of the gate.

The present application also provides a method for manufacturing a LDMOS transistor comprising:

providing a semiconductor substrate, wherein a doping region of a first doping type formed in an upper part of the semiconductor substrate;

forming a STI structure between a source region and a drain region located in the doping region of the first doping type, wherein the STI structure comprises a laminated structure formed in a shallow trench, the laminated structure comprises a stack of alternate layers of insulating material and ferroelectric material and in the laminated structure a lowest layer and an uppermost layer are the insulating material layers;

forming a first well region of the first doping type and a second well region of a second doping type in the doping region of the first doping type, wherein the first doping type and the second doping type opposite in polarity to each other;

forming a gate on the semiconductor substrate, wherein the gate has one side extending above the second region of the second doping type and an opposite side extending to and above the STI structure;

forming a light doping region of the first doping type in a source region in the second well region of the second doping type;

forming a heavy doping region of the first doping type in a source region in the second well region of the second doping type, and forming a heavy doping region of the first doping type in a drain region in the first well region of the first doping type;

forming a contact hole on the gate and a shielding contact hole in the insulating material layer of the uppermost layer of the laminated structure; and forming a metal layer electrically connecting to the gate contact hole and shielding contact.

In one embodiment, the method further comprises: prior to the step of forming the heavy doping region of the source region and the heavy doping region of the drain region, forming a side wall spacer at the side of the gate.

In one embodiment, the method further comprises: forming a heavy doping region of the second doping type contacting to the source region of the first doping type in the well region of the second doping type, wherein the heavy doping region of the second doping type is located at one side of the source region of the first doping type away from the gate.

In one embodiment, the material of the ferroelectric material layers comprises a hafnium oxide-based material doped with aluminum and/or zirconium In one embodiment, the shallow trench has a depth of 4800 Å~5400 Å, and a distance between the bottom wall of the lowest ferroelectric material layer of the laminated structure and the bottom of the shallow trench is 100 Å~600 Å.

In one embodiment, the laminated structure comprises N layer of the ferroelectric material layers, in which N≤3, each layer of the ferroelectric material layers has a thickness of 500 Å-1200 Å, and the neighboring two ferroelectric material layers has an interval distance of 200 Å~500 Å.

According to the above, in the LDMOS transistor and the manufacturing method of the present application, the metal layer connects the gate contact and the shielding contact of STI structure to form capacitor structure between the gate (with shielding contact on STI) and drain (connected to the drift zone). When the transistor is on, more electrons can be induced in the interface of drift zone and the lower part of the insulating material layer of the STI structure, i.e. upper surface of drift zone of LDMOS, thereby the $R_{on}$ can be reduced. When the transistor is off, the potential at the gate with shielding contact on STI depletes electrons and induces depletion area in the drift region, thereby the BV can be increased. Moreover, by the formation of the laminated structure having the stack of alternate layers of the insulating material and the ferroelectric material in the STI structure, the ferroelectric material in the STI structure has stronger polarization after re-crystallization. When the transistor is on, the higher gate voltage can induce more electrons in the interface of the drift zone and the lower part of the insulating layer of the STI structure i.e. upper surface of drift zone of LDMOS, thereby the $R_{on}$ can be reduced. When the transistor is off, the grounded gate with shielding contact of STI depletes electrons and induces depletion area in the drift zone, thereby the BV can be increased. Therefore, an enhancement of BV and reduction of $R_{on}$ of the LDMOS transistor can be achieved simultaneously.

BRIEF DESCRIPTION OF THE DRAWINGS

FIG. 11 also shows the structure of the LDMOS transistor in the Example 2 of the present application.

LIST OF REFERENCE SYMBOLS

100 semiconductor substrate
101 N-type doping region
102 N-type well region
103 P-type well region
104 source region
104a source light doping region
104b source heavy doping region
105 drain region
106 shallow trench
107 laminated structure
107a insulating material layer
107b ferroelectric material layer
108 gate
108a gate dielectric layer
108b gate polysilicon layer
109 side wall
110 contact hole
111 metal layer
112 P-type heavy doping region
113 channel
S1~S8 step

DETAILED DESCRIPTION OF THE EMBODIMENTS

The preferred embodiments are described in detail below to explain the present application. A person having ordinary skills in the art is able to easily understand other advantages and effects based on the disclosure of the specification. The present application may have other embodiments in addition to the detailed description. Various details in this specification can be modified or changed based on different viewpoints and applications without departing from the spirit of the present invention Please refer to FIG. 1 to FIG. 11. The drawings provided in the examples are merely used to illustrate the basic concepts of the present application. The drawings shows the components relevant to the present application but may not show the real number, shape or size of the real devices. In practice, the number, shape or size of the devices can be changed, and the arrangement of the devices may be more complex.

EXAMPLE 1

This example provides a method for manufacturing a LDMOS transistor. For easy understanding, a method for manufacturing an N type LDMOS transistor is described. Depending on situation, a person having ordinary skills in the art is able to vary the doping type of the transistor to obtain a P type LDMOS transistor with same structure and manufacturing method thereof.

For example, in the N type LDMOS transistor, the metal layer connects the gate contact and the shielding contact on STI structure to form the capacitor structure between the gate (with shielding contact on STI) and the drain (with drift region). When the transistor is on, the gate voltage is at high and can induce more electrons in the interface of drift region and lower part of the insulating layer of the STI structure i.e. upper surface of drift zone of LDMOS, thereby the $R_{on}$ can be reduced. When the transistor is off, the gate with shielding contacts on STI is grounded and depletes electrons and induces depletion area in the drift region, thereby the BV can be increased. Therefore, the enhancement of BV and reduction of $R_{on}$ of the LDMOS transistor device can be achieved simultaneously. Moreover, by the formation of the laminated structure having the alternate layers of the insulating material and the ferroelectric material in the STI structure, the ferroelectric material in the STI structure has stronger polarization after re-crystallization. When the transistor is on, the higher gate voltage can induce more electrons in the interface of drift region and the lower part of the insulating layer of the STI structure i.e. the surface of drift zone of LDMOS, thereby the $R_{on}$ can be reduced. When the transistor is off, the gate with shielding contact on STI is grounded and depletes electrons and induces depletion area in the drift region, thereby the BV can be increased. Therefore, the enhancement of BV and reduction of $R_{on}$ of the LDMOS transistor device can be achieved simultaneously.

As shown in FIG. 1 to FIG. 11, the method comprises the following steps.

Figure 1:
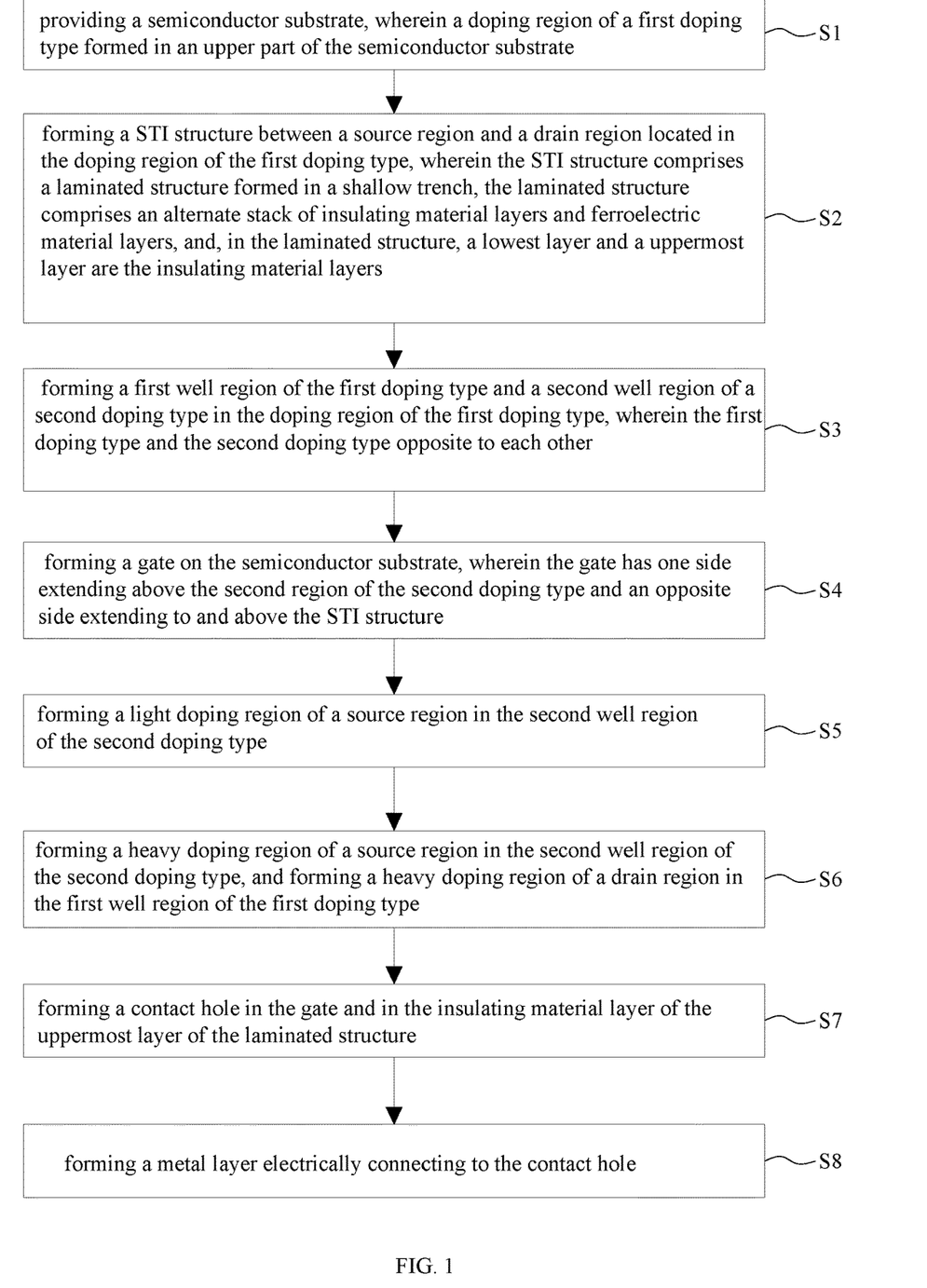
FIG. 1 shows, according to Example 1 of the present application, a flow chart of a method for manufacturing a LDMOS transistor.
Figure 2:
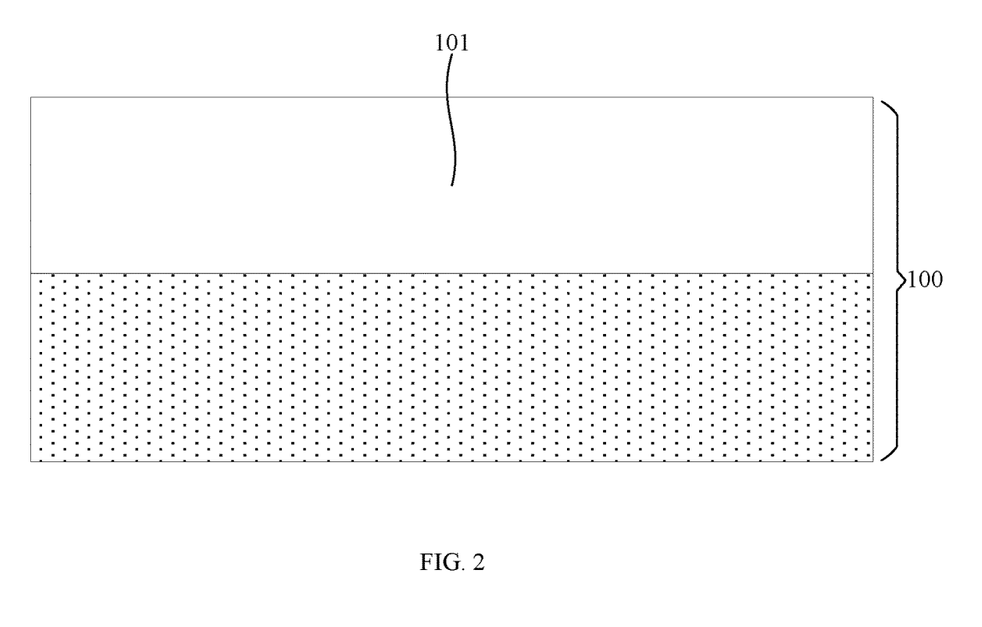
FIG. 2 shows, according to Example 1 of the present application, the structure at the step S1 of the method for manufacturing a LDMOS transistor.

As shown in FIG. 1 and FIG. 2, the step S1 is conducted: providing a semiconductor substrate 100, wherein an N-type doping region 101 is formed in an upper part of the semiconductor substrate 100.

In one example, the semiconductor substrate 100 is P-type. In the semiconductor substrate 100, an N-type buried layer (not shown in FIG. 2) and a P-type epitaxial layer (not shown in FIG. 2) can be further formed from bottom part to upper part of the substrate 100. The N-type buried layer can be formed by ion implantation.

In one example, the N-type doping region 101 can be formed by ion implantation and thermal drive-in steps.

Figure 3:
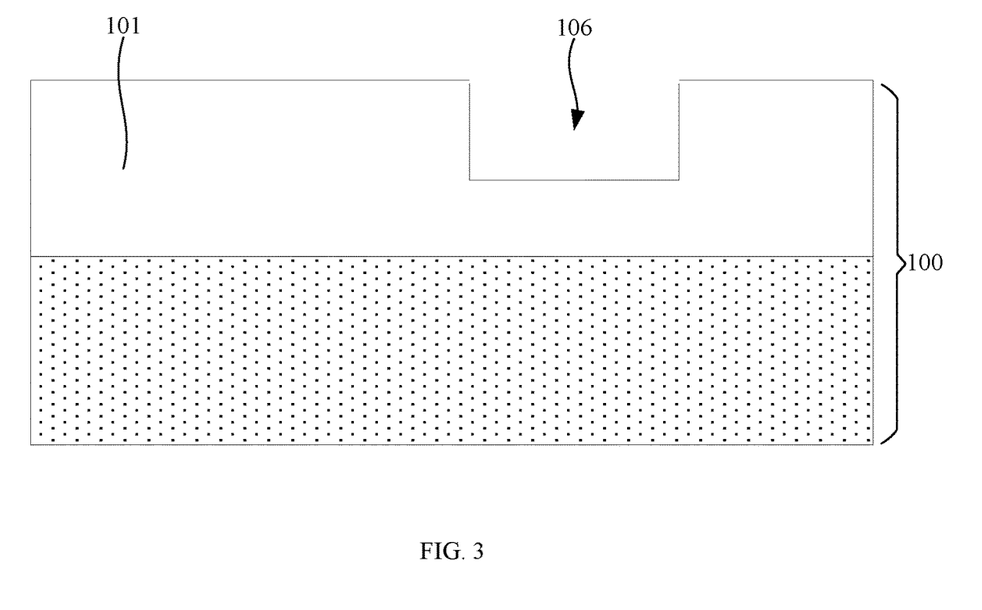
FIG. 3 shows, according to Example 1 of the present application, the structure of the shallow trench at the step S2 of the method for manufacturing a LDMOS transistor.
Figure 4:
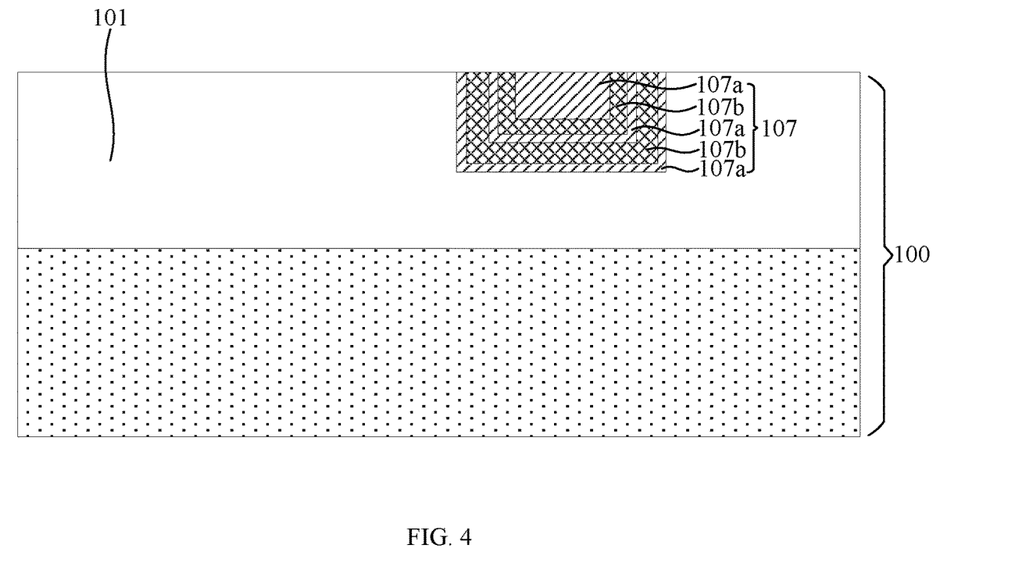
FIG. 4 shows, according to Example 1 of the present application, the structure of the laminated structure at the step S2 of the method for manufacturing a LDMOS transistor.

As shown in FIG. 1, FIG. 3 and FIG. 4, the step S2 is conducted: forming the STI structure as shown in FIG. 3 between a source region and a drain region located in the N-type doping region 101. The STI structure comprises a laminated structure 107 formed in a shallow trench 106. The laminated structure 107 comprises a stack of alternate layers of insulating material 107a and ferroelectric material 107b, and, in the laminated structure 107, a lowest layer and an uppermost layer are the insulating material layers 107a.

In one example, the method for forming the STI structure comprises: forming an oxide layer on the surface of the semiconductor substrate 100, i.e. the N-type doping region 101; depositing a nitride layer (not shown in FIG. 3 for simplicity) on the oxide layer; forming a patterned photoresist layer; dry etching the oxide layer and the nitride layer; removing the patterned photoresist layer; dry etching to remove a part of the semiconductor substrate 100 to form the shallow trench 106 in the semiconductor substrate 100 as shown in FIG. 3; forming a liner oxide layer on the surface of the shallow trench 106 by thermal oxidation process; forming a high-density plasma oxide layer by a high-density plasma process and a thermal annealing process to fill the shallow trench 106; planarizing the high-density plasma oxide layer by chemical mechanical polishing by using the above nitride layer as polishing barrier layer, wherein the liner oxide layer and the high-density plasma oxide layer formed in the shallow trench 106 are the insulating material layers 107a of the lowest layer of the laminated structure 107; then, forming the patterned photoresist layer (to open the LDMOS areas) and etch the high density plasma oxide; then deposit the ferroelectric material layers 107b in the laminated structure 107; by physical vapor deposition (PVD) or atomic layer deposition (ALD); forming high density plasma oxide layer and ferroelectric layer repeatedly as desired with plasma oxide layer as the final layer; then planarizing the stack layer by chemical mechanical polishing by using the above nitride layer as polishing barrier layer. Finally, the nitride layer and the oxide layer are removed to form the laminated structure 107 with a desired number of layers as shown in FIG. 4. The laminated structure 107 as shown in FIG. 4 includes three insulating material layers 107a and two ferroelectric material layers 107b for illustration purpose. Note that the laminated stack layers are only for LDMOS, where the CMOS has the usual STI structure with oxide filled (not shown in and FIG. 4 for simplicity).

In one example, the ferroelectric material layer 107b can be formed by any ferroelectric material suitable for CMOS process. Preferably, in this example, the material of the ferroelectric material layer 107b is a hafnium oxide-based material doped with aluminum and/or zirconium; which can enhance the breakdown voltage (BV) of LDMOS transistor and reduce the on resistance ($R_{on}$) of LDMOS transistor.

The inventor found that the parameters such as the thickness and depth of the ferroelectric layer 107b and the width and depth of the shallow trench 106 affect the breakdown properties of the LDMOS transistor. In this example, the shallow trench 106 has a depth of 4800 Å-5400 Å, and the distance between the bottom wall of the lowest ferroelectric material layer 107b of the laminated structure 107 and the bottom of the shallow trench 107 is 100 Å-600 Å. Preferably, the laminated structure 107 comprises N layer of the ferroelectric material layers 107b, in which N≤3, each layer of the ferroelectric material layers 107b has a thickness of 500 Å-1200 Å, and the neighboring two ferroelectric material layers 107b has an interval distance of 200 Å~500 Å. The plural ferroelectric layers 107b have stronger polarization after re-crystallization.

Figure 5:
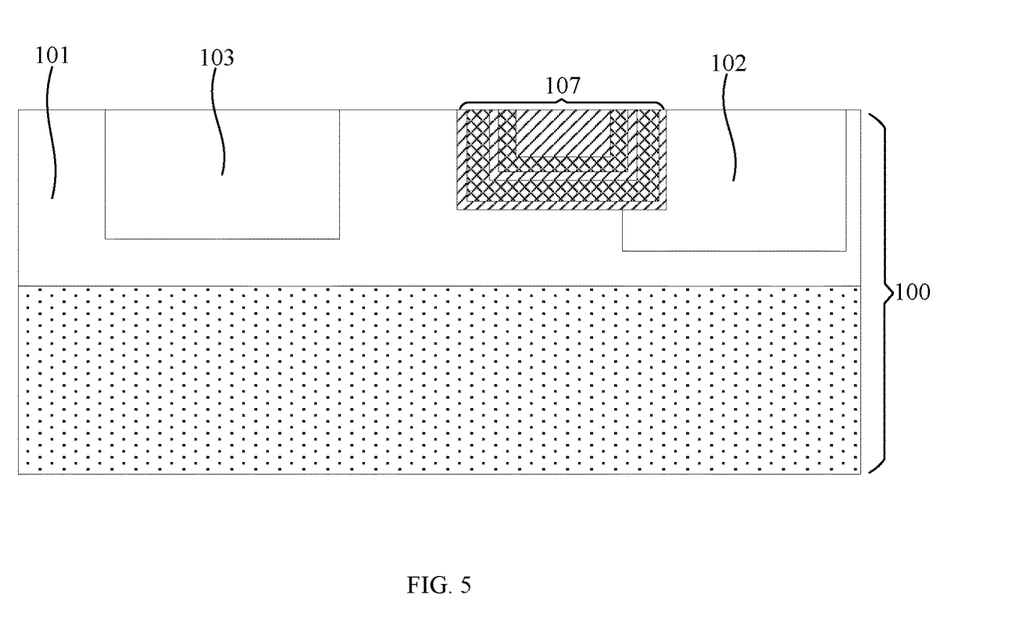
FIG. 5 shows, according to Example 1 of the present application, the structure at the step S3 of the method for manufacturing a LDMOS transistor.

As shown in FIG. 1 and FIG. 5, the step S3 is conducted: in the N-type doping region 101, forming the N-type well region 102 and the P-type well region 103 with an opposite doping type.

In one example, depending on situation, the STI structure can be set within the N-type well region 102, or can be partially set in N-type well region 102 as shown in FIG. 5, or can be non-overlapping with N-type well region 102, which is not a limitation for the present application.

In the step S3 of this example, the method for forming the N-type well region 102 and the P-type well region 103 with opposite doping types in the N-type doping region 101 comprises: applying photolithography steps to respectively open the implantation area of the N-type well region 102 and P-type well region 103; implanting N-type impurity ions and P-type impurity ions respectively; and diffusing the impurity ions by applying a rapid thermal annealing process, wherein the corresponding N-type well region 102 and P-type well region 103 can be formed by the impurity ions base on the corresponding implantation area.

Figure 6:
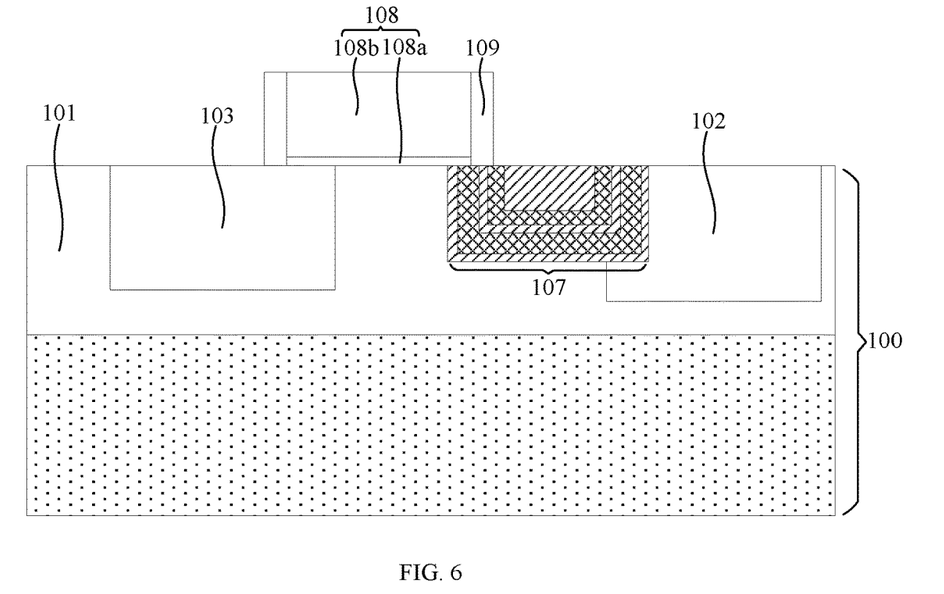
FIG. 6 shows, according to Example 1 of the present application, the structure at the step S4 of the method for manufacturing a LDMOS transistor.

As shown in FIG. 1 and FIG. 6, the step S4 is conducted: forming the gate 108 on the semiconductor substrate 100, wherein the gate 108 has one side extending above the P-type well region 103 and an opposite side extending to and above the STI structure.

In the step S4 of this example, the method for forming the gate 108 comprises forming a dielectric layer on the semiconductor substrate 100, forming a polysilicon layer on the dielectric layer, forming an anti-reflective coating layer, forming a patterned photoresist layer, dry etching the polysilicon layer and the dielectric layer to form a gate dielectric layer 108a and a gate polysilicon layer 108b, removing the photoresist layer and the anti-reflective coating layer thereunder. In this example, the gate 108 comprises the gate dielectric layer 108a and the gate polysilicon layer 108b.

Figure 7:
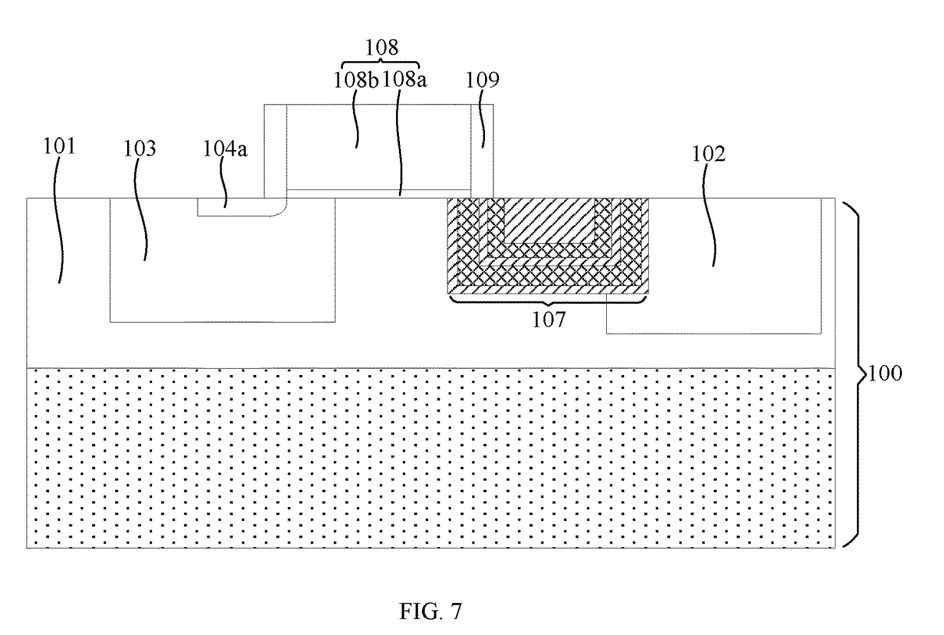
FIG. 7 shows, according to Example 1 of the present application, the structure at the step S5 of the method for manufacturing a LDMOS transistor.

As shown in FIG. 1 and FIG. 7, the step S5 is conducted: forming the source light doping region 104a in the P-type well region 103.

In this example, the method for forming the source light doping region 104a comprises: forming a patterned photoresist on the semiconductor substrate 100 to expose a partial region of the P-type well region 103; forming the source light doping region 104a in the exposed region without coverage of the photoresist by applying ion implantation; and removing the patterned photoresist.

Figure 8:
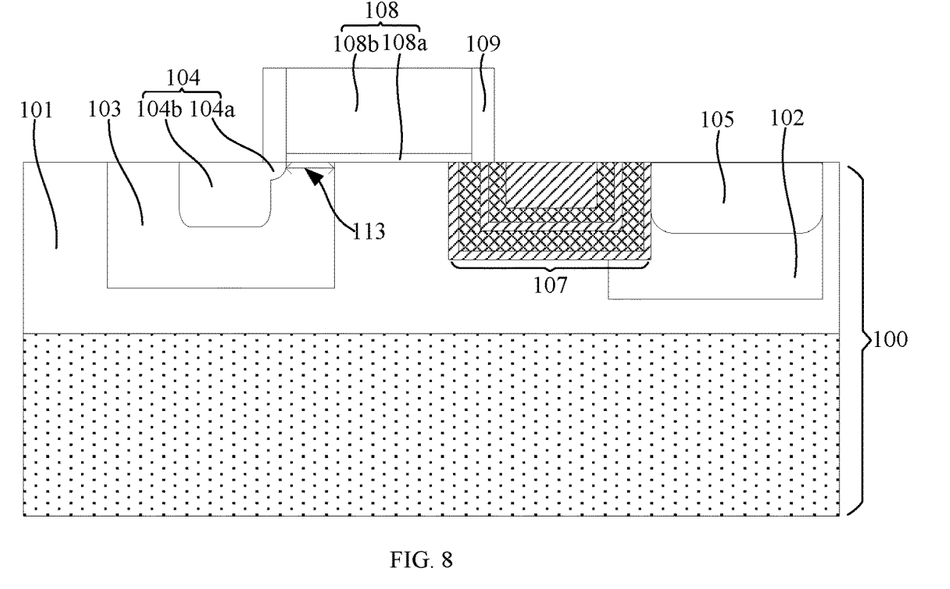
FIG. 8 shows, according to Example 1 of the present application, the structure at the step S6 of the method for manufacturing a LDMOS transistor.

As shown in FIG. 1 and FIG. 8, the step S6 is conducted: forming the source heavy doping region 104b in the P-type well region 103, and forming the drain heavy doping region 105 in the N-type well region 102.

In this example, the method for forming the source heavy doping region 104b and the drain heavy doping region 105 comprises: forming a patterned photoresist on the semiconductor substrate 100 to expose a partial region of the P-type well region 103 and a partial region of the N-type well region 102; applying an ion implantation process and a rapid thermal annealing process to form the source heavy doping region 104b and the drain heavy doping region 105 in the exposed regions; and removing the patterned photoresist. In this example, the source region 104 comprises the source light doping region 104a and the source heavy doping region 104b, and the drain region is the drain heavy doping region 105. Between one side of the source region and one side of its neighboring P-type well region 103, a channel 113 of the LDMOS transistor is formed.

As shown in FIG. 6 to FIG. 8, in one example, prior to forming the source heavy doping region 104b and the drain heavy doping region 105, it further comprises forming a side wall spacer 109 on the side of the gate 108. The method comprises: forming a layer of the side wall spacer material on the semiconductor substrate 100, and dry etching the layer of the side wall spacer material. The residual of the layer of the side wall material forms the side wall spacer 109 on the two sides of the gate 108.

Figure 9:
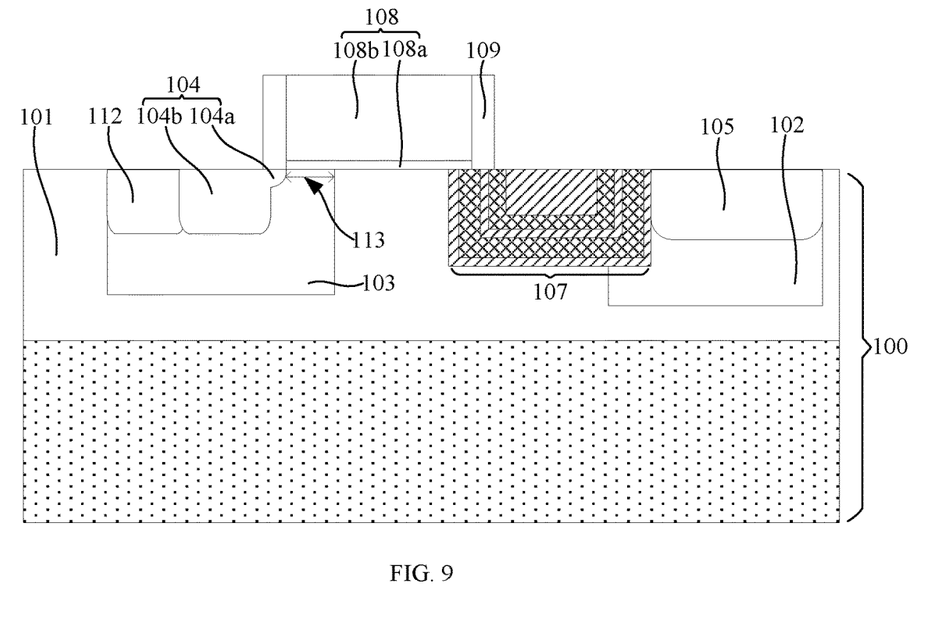
FIG. 9 shows, according to Example 1 of the present application, the formation of P-type of heavy doping region at the step S6 of the method for manufacturing a LDMOS transistor.

In one example, as shown in FIG. 9, a P-type heavy doping region 112 is formed in the P-type well region 103 to contact with the source region 104. The P-type heavy doping region 112 is located at one side of the source region 104 away from the gate 108.

Figure 10:
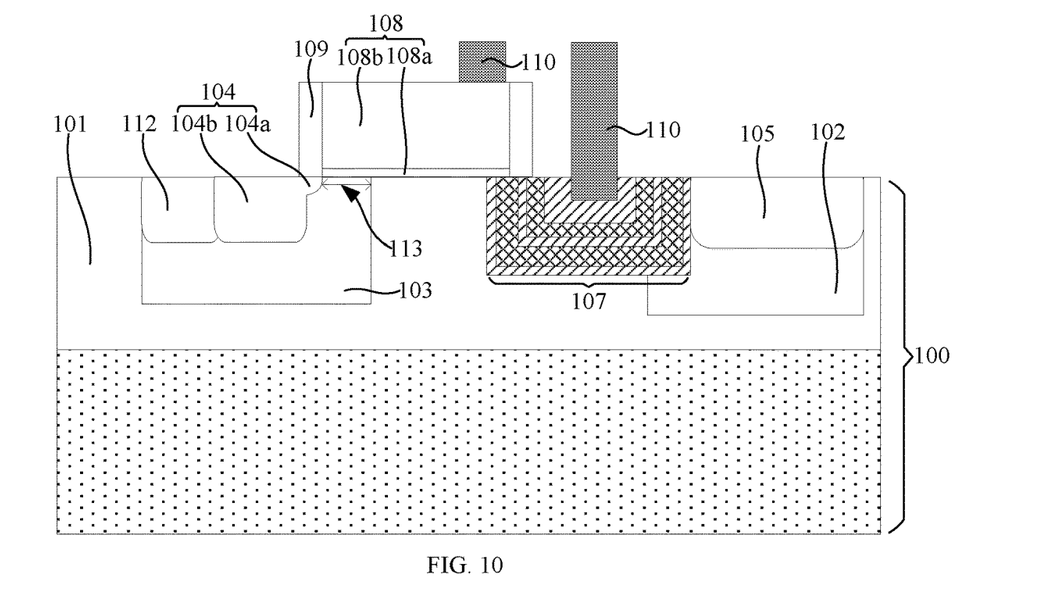
FIG. 10 shows, according to Example 1 of the present application, the structure at the step S7 of the method for manufacturing a LDMOS transistor

As shown in FIG. 1 and FIG. 10, the step S7 is conducted: forming the contact hole 110 on the gate 108 and the uppermost insulating material layer 107a of the laminated structure 107 by deposition of dielectric layer, e.g. plasma Si-oxide (referred to as inter poly-metal dielectric layer, or ILD) and followed by CMP and formation of contact holes (by patterning and etching steps). The inter poly-metal dielectric layer (ILD) is not shown in FIG. 10 and FIG. 11 for simplicity. In one example, the contact hole 110 is filled with metal (e.g. W). It should be mentioned that depending on the etching selectivity between poly Si and oxide, the contact hole 110 can be formed on the surface of the uppermost insulating material layer 107a of the laminated structure 107, or can be formed into its inner layers by longer etching time.

Figure 11:
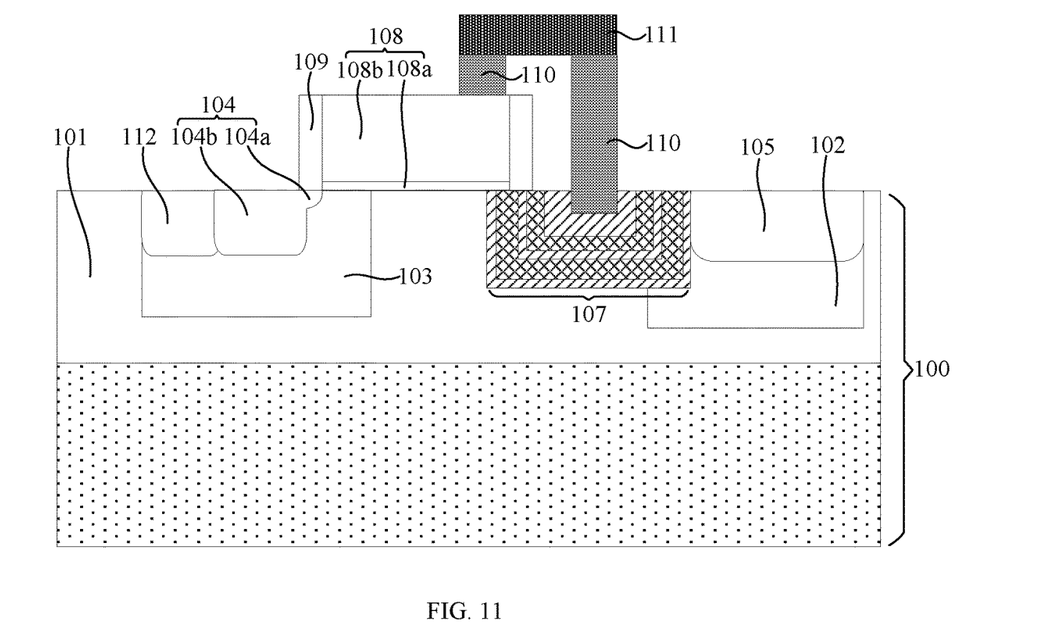
FIG. 11 shows, according to Example 1 of the present application, the structure at the step S8 of the method for manufacturing a LDMOS transistor.

As shown in FIG. 1 and FIG. 11, the step S8 is conducted: forming a metal layer 111 electrically connecting to the contact hole 110. The metal layer can be formed by usual methods as known to those who are familiar with CMOS technology. Via the contact hole 110, the gate 108 and the STI structure are connected to the metal layer 111.

In this example, by setting the contact hole 110 and the metal layer 111 between the gate 108 and the shielding contact on STI structure, a capacitor structure is formed between the gate 108 and the drain. When the transistor is on, additional electrons can be induced in the interface of drift region and the lower part of the insulating material layer of the STI structure, i.e. upper interface of the drift zone of LDMOS, thereby the $R_{on}$ can be reduced. When the transistor is off, the gate and shielding contact are grounded and depletes electrons and induces depletion area in the drift region, thereby the BV can be increased. Moreover, by the formation of the laminated structure 107 having the alternate stack of the insulating material layers 107a and the ferroelectric material layers 107b in the STI structure, the ferroelectric material layer in the STI structure has stronger polarization after re-crystallization. When the transistor is on, the higher gate voltage can induce more electrons in the interface of drift region and the lower part of the insulating material layer of the STI structure i.e. upper interface of the drift zone of LDMOS, thereby the $R_{on}$ can be reduced. When the transistor is off, the gate and shielding contact on STI are grounded and depletes electrons and induces depletion area in the drift region, thereby the BV can be further increased. Therefore, the enhancement of BV and reduction of $R_{on}$ of the LDMOS transistor device can be achieved simultaneously.

EXAMPLE 2

This example provides a LDMOS transistor, and the LDMOS transistor can be prepared by, but not limited to, the method of the above Example 1, so long as the LDMOS transistor of the present application can be formed. Advantages of the LDMOS transistor can be referred to the Example 1 and are not repeatedly explain herein. Further, the following example illustratively discloses the N-type LDMOS transistor, but a person having ordinary skills in the art is able to, depending on requirements, alter the doping type of the transistor to obtain a P-type LDMOS transistor having the same structure.

As shown in FIG. 11, the LDMOS transistor comprises: a semiconductor substrate 100 having a N-type doping region 101 formed in an upper part of the semiconductor substrate 100, wherein the N-type doping region 101 has a N-type well region 102 and a P-type well region 103 therein, and the N-type well region 102 and the P-type well region 103 have the doping types opposite to each other;

a source region 104 located in the P-type well region 103 and a drain region 105 located in the N-type well region 102;

a STI structure between the source region 104 and the drain region 105, wherein the STI structure comprises a laminated structure 107 formed in a shallow trench 106, the laminated structure 107 comprises an alternate stack of insulating material layers 107a and ferroelectric material layers 107b, and, in the laminated structure 107, a lowest layer and an uppermost layer are the insulating material layers 107a;

a gate 108 on the semiconductor substrate 100, wherein the gate 108 has one side extending above the source region 104 and an opposite side extending above the STI structure;

a contact hole 110 connecting the gate 108 and the insulating material layer 107a of the uppermost layer of the laminated structure 107; and a metal layer 111 electrically connecting to the contact hole 110.

In one example, the material of the ferroelectric material layers 107b comprises a hafnium oxide-based material doped with aluminum and/or zirconium In one example, the shallow trench 106 has a depth of 4800 Å~5400 Å, and a distance between the bottom wall of the lowest ferroelectric material layer 107a of the laminated structure 107 and the bottom of the shallow trench 107 is 100 Å~600 Å. Preferably, the laminated structure 107 comprises N layer of the ferroelectric material layers 107b, in which N≤3, each layer of the ferroelectric material layers 107b has a thickness of 500 Å~1200 Å, and the neighboring two ferroelectric material layers 107b has an interval distance of 200 Å~500 Å.

In one example, the P-type well region 103 comprises a P-type heavy doping region 112 contacting the source region 104, and the P-type heavy doping region 112 locates at the side of the source region 104 away from the gate 108.

In one example, the STI structure contacts with the drain region 105, and the gate 108 comprises a gate dielectric layer 108a on the semiconductor substrate 100, and a gate polysilicon layer 108b on the gate dielectric layer 108a, and a side wall 109 covering the side of the gate 108.

According to the above, the present application provides a LDMOS transistor and a manufacturing method thereof. A capacitor structure is formed between the gate (with shielding contact on STI) and drain (with drift region) by setting the contact hole and the metal layer between the gate and the STI structure. When the transistor is on, additional electrons can be induced in the interface of drift region and the lower part of the insulating material layers of the STI structure, i.e. upper surface of the drift zone of LDMOS, thereby the $R_{on}$ can be reduced. When the transistor is off, the gate and shielding contact depletes electrons and induces depletion area in the drift region, thereby the BV can be increased. Moreover, by the formation of the laminated structure having the alternate stack of the insulating material layers and the ferroelectric layers in the STI structure, the ferroelectric layer in the STI structure have stronger polarization performance after re-crystallization. When the transistor is on, the higher gate voltage can induce more electrons in the interface of drift region and the lower part of the insulating material layer of the STI structure i.e. the upper surface of the drift zone of LDMOS, thereby the $R_{on}$ can be reduced.

When the transistor is off, the gate with shielding contact on STI is grounded and depletes electrons and induces depletion area in the drift region, thereby the BV can be increased. Therefore, the enhancement of BV and reduction of $R_{on}$ of the LDMOS transistor device can be achieved simultaneously. The present application overcomes the drawbacks in the conventional technologies.

While the present invention is disclosed by reference to the preferred embodiments and examples detailed above, it is to be understood that these examples are intended in an illustrative rather than in a limiting sense. A person having ordinary skills in the art is able to modify or change the above embodiments without departing from the spirit and scope of the present invention. It is contemplated that modifications and changes will readily occur to those skilled in the art, which modifications and combinations will be within the spirit of the invention and the scope of the following claims and its equivalent systems and methods.

What is claimed is:

1. A laterally diffused metal oxide semiconductor (LDMOS) transistor comprising:

a semiconductor substrate having a doping region of a first doping type formed in an upper part of the semiconductor substrate, wherein the doping region comprises a first well region of the first doping type and a second well region of a second doping type, and the first doping type and the second doping type opposite to each other;

a source region located in the second well region and a drain region located in the first well region;

a shallow trench isolation (STI) structure between the source region and the drain region, wherein the STI structure comprises a laminated structure formed in a shallow trench, the laminated structure comprises an alternate layers of insulating material and ferroelectric material , and, in the laminated structure, a lowest layer and an uppermost layer are the insulating material layers;

a gate on the semiconductor substrate, wherein the gate has one side extending above the source region and an opposite side extending above the STI structure;

a contact on the gate and a contact on the insulating material layer of the uppermost layer of the laminated structure; and a metal layer electrically connecting to the contact on the gate and the contact on the insulating material layer of the uppermost layer.

2. The LDMOS transistor of claim 1, wherein the ferroelectric material layer comprises a hafnium oxide-based material doped with aluminum and/or zirconium.

3. The LDMOS transistor of claim 1, wherein the shallow trench has a depth of 4800 Å~5400 Å, and a distance between the bottom wall of the lowest ferroelectric material layer of the laminated structure and the bottom of the shallow trench is 100 Å~600 Å.

4. The LDMOS transistor of claim 3, wherein the laminated structure comprises N layer of the ferroelectric material layers, in which N≤3, each layer of the ferroelectric material layers has a thickness of 500 Å-1200 Å, and the neighboring two ferroelectric material layers has an interval distance of 200 Å~500 Å.

5. The LDMOS transistor of claim 1, wherein the second well region of the second doping type comprises a heavy doping region of the second doping type contacting the source region of the first doping type, and the heavy doping region locates at one side away from the gate.

6. The LDMOS transistor of claim 1, wherein the first doping type is N type or P type.

7. The LDMOS transistor of claim 1, wherein the STI structure contacts with the drain region, and the gate comprises a gate dielectric layer on the semiconductor substrate, and a gate polysilicon layer on the gate dielectric layer, and a side wall covering the side of the gate.

8. A method for manufacturing a laterally diffused metal oxide semiconductor (LDMOS) transistor comprising:
   providing a semiconductor substrate, wherein a doping region of a first doping type formed in an upper part of the semiconductor substrate;
   forming a shallow trench isolation (STI) structure between a source region and a drain region located in the doping region of the first doping type, wherein the STI structure comprises a laminated structure formed in a shallow trench, the laminated structure comprises a stack of alternate layers of insulating material and ferroelectric material, and, in the laminated structure, a lowest layer and an uppermost layer are the insulating material layers;
   forming a first well region of the first doping type and a second well region of a second doping type in the doping region of the first doping type, wherein the first doping type and the second doping type are opposite in polarity to each other;
   forming a gate on the semiconductor substrate, wherein the gate has one side extending above the second region of the second doping type and an opposite side extending to and above the STI structure;
   forming a light doping region of a source region of the first doping type in the second well region of the second doping type;
   forming a heavy doping region of a source region of the first doping type in the second well region of the second doping type, and forming a heavy doping region of a drain region of the first doping type in the first well region of the first doping type;
   forming a contact hole in the gate and a contact hole in the insulating material layer of the uppermost layer of the laminated structure; and
   forming a metal layer electrically connecting to the contact holes.

9. The method of claim 8, which further comprises: prior to the step of forming the heavy doping region of the source region and the heavy doping region of the drain region, forming a side wall spacer at the side of the gate.

10. The method of claim 8, which further comprises: forming a heavy doping region of the second doping type contacting to the source region in the well region of the second doping type, wherein the heavy doping region of the second doping type is located at one side of the source region away from the gate.

11. The method of claim 8, wherein the ferroelectric material layers comprises a hafnium oxide-based material doped with aluminum and/or zirconium.

12. The method of claim 8, wherein the shallow trench has a depth of 4800 Å~5400 Å, and a distance between the bottom wall of the lowest ferroelectric material layer of the laminated structure and the bottom of the shallow trench is 100 Å~600 Å.

13. The method of claim 12, wherein the laminated structure comprises N layer of the ferroelectric material layers, in which N≤3, each layer of the ferroelectric material layers has a thickness of 500 Å-1200 Å, and the neighboring two ferroelectric material layers has an interval distance of 200 Å~500 Å.

* * * * *